United States Patent
Huang et al.

[11] Patent Number: 6,008,108
[45] Date of Patent: Dec. 28, 1999

[54] METHOD OF FABRICATING A SHALLOW-TRENCH ISOLATION STRUCTURE IN AN INTEGRATED CIRCUIT

[75] Inventors: Chen-Nan Huang, Kaohsiung; Horng-Bor Lu, Hsinchu, both of Taiwan

[73] Assignee: United Microelectronics Corp., Hsinchu, Taiwan

[21] Appl. No.: 09/206,816

[22] Filed: Dec. 7, 1998

[51] Int. Cl.⁶ .................................................. H01L 21/76
[52] U.S. Cl. ........................ 438/436; 438/424; 438/438; 438/435; 148/DIG. 50
[58] Field of Search ..................................... 438/435, 436, 438/437, 438, 428, 692; 148/DIG. 50

[56] References Cited

U.S. PATENT DOCUMENTS

| | | | |
|---|---|---|---|
| 5,189,501 | 2/1993 | Kawamura et al. | 438/437 |
| 5,435,888 | 7/1995 | Kalnitsky et al. | 438/435 |
| 5,795,811 | 8/1998 | Kim et al. | 438/435 |
| 5,872,043 | 2/1999 | Chen | 438/424 |

*Primary Examiner*—Trung Dang
*Attorney, Agent, or Firm*—Hickman Stephens & Coleman, LLP

[57] ABSTRACT

A semiconductor fabrication method is provided for the fabrication of a shallow-trench isolation (STI) structure in integrated circuit. Conventionally, the insulating plug of the STI structure would be undesirably formed with microscratches in its top surface resulting from chemical-mechanical polishing (CMP) process, thus causing an undesired bridging effect thereacross when conductive layers are subsequently formed. This method can help solve this problem by forming a mending dielectric layer over the insulating plug of the STI structure to mend these microscratches. Since the mending dielectric layer is in a flowable state when it is being coated over the wafer, it can fill up all the microscratches in the top surface of the insulating plug, thereby mending the microscratches to prevent the bridging effect across the insulating plug that would other-wise occur in the case of the prior art. This method can thus help the resulting IC device to be more reliable in operation and also can help increase the yield rate of the wafer fabrication.

18 Claims, 5 Drawing Sheets

6,008,108

METHOD OF FABRICATING A SHALLOW-TRENCH ISOLATION STRUCTURE IN AN INTEGRATED CIRCUIT

BACKGROUND OF THE INVENTION

1. Field of the Invention:

This invention relates to semiconductor fabrication technology, and more particularly, to a method of fabricating a shallow-trench isolation (STI) structure in an integrated circuit.

2. Description of Related Art:

The shallow-trench isolation (STI) structure is a widely used isolation structure in integrated circuits for electrically isolating the various active components in the integrated circuit. A conventional method of forming an STI structure includes a first step of forming a trench in the substrate through an anisotropic etching process, a second step of depositing oxide into the trench, and a final step of performing a chemicalmechanical polishing (CMP) process to planarize the top surface of the oxide in the trench. The oxide in the trench then serves as the intended STI structure. One benefit of using the STI structure is that its topmost surface is substantially level with the topmost surface of the substrate.

One drawback to the foregoing method, however, is that the CMP process scratches the top surface of the oxide in the STI structure, thus forming undesired microscratches in the top surface of the oxide in the STI structure. The forming of these microscratches then causes some problems in the resulting IC device. To better depict this drawback, the conventional STI fabrication method is schematically depicted, step-by-step, in full detail in the following with reference to FIGs. 1A–1E.

Referring first to FIG. 1A, in the first step, a semiconductor substrate 100 is prepared. Subsequently, a pad oxide layer 102 is formed over the substrate 100 for surface protection of the substrate 100. After this, a mask layer 104 is formed over the pad oxide layer 102, preferably from silicon nitride through a low-pressure chemical vapor deposition (LPCVD) process.

Referring next to FIG. 1B, in the subsequent step, a selective etching process is performed to etch into a selected area of the wafer. Etching proceeds successively through the mask layer 104 and the pad oxide layer 102 until reaching a predefined depth in the substrate 100. Through this process, a trench 106 is formed in the substrate 100.

Referring next to FIG. 1C, in the subsequent step, a thermal oxidation process is performed on the wafer, whereby the exposed part of the substrate 100 is oxidized to form a liner oxide layer 108 on the bottom and sidewalls of the trench 106. This liner oxide layer 108 is formed to such an extent as to come into junction with the pad oxide layer 102. Next, a dielectric material, preferably silicon oxide, is deposited through an atmospheric-pressure chemical vapor deposition (APCVD) process into the trench 106 and also over the top surface of the wafer to thereby form an insulating layer 110. After this, a densification process is performed on the wafer in such a manner as to place the wafer in a gaseous nitrogen environment under a high temperature condition, whereby the insulating layer 110 is densified.

Referring next to FIG. 1D, in the subsequent step, a chemical-mechanical polishing (CMP) process is performed on the wafer until reaching the top surface of the mask layer 104, whereby all the surface part of the insulating layer 110 that is laid above the mask layer 104 is removed (the remaining part is here designated by the reference numeral 110a and is here and hereinafter referred to as an insulating plug). The CMP technique is a widely used and well-known surface polishing process in semiconductor fabrication, so details thereof will not be further described.

One drawback to the use of the CMP process, however, is that it scratches the top surface of the resulting insulating plug 110a, thus forming undesired microscratches 112 in the top surface of the insulating plug 110a. These microscratches 112 result because it is necessary to over-polish the mask layer 104 during the CMP process so as to ensure that the overlying part of the insulating layer 110 is entirely removed. Since the mask layer 104 (which is formed from silicon nitride) is harder than the insulating layer 110 (which is formed from silicon oxide), the slurry used in the CMP process together with the particles from the polished mask layer 104 abrade the top surface of the insulating plug 110a, thus resulting in formation of the microscratches 112 in the top surface of the insulating plug 110a.

Referring next to FIG. 1E, in the subsequent step, the mask layer 104 is entirely etched away by using a hot phosphate solution as the etchant. Next, the pad oxide layer 102 is also entirely etched away by using hydrofluoric acid (HF) as the etchant. Through these two etching processes, the insulating plug 110a (FIG. 1D) is also partly etched away (the remaining part thereof is here designated by the reference numeral 110b for distinguishing purpose). The remaining insulating plug 110b and the liner oxide layer 108 in the previously formed trench 106 (FIG. 1B) in combination constitute the intended STI structure.

One drawback to the use of the HF solution, however, is that it would also etch into the microscratches 112 in the top surface of the insulating plug 110a (FIG. 1D), thus further enlarging the microscratches 112. When conductive layers, such as doped polysilicon layers, are being formed on both sides of the insulating plug 110b, some of the doped polysilicon can be accidentally deposited into the microscratches 112, thus resulting in a bridging effect across the insulating plug 110b. The bridging effect across the insulating plug 110b causes leakage current to flow across the insulating plug 110b, thus making the resulting STI structure lose its isolating ability. As a consequence, the resulting IC device may be unreliable in operation. Moreover, it can cause pattern distortion that makes the resulting IC device inoperable, thus decreasing the yield rate of the wafer fabrication.

SUMMARY OF THE INVENTION

It is therefore an objective of the present invention to provide a method for fabricating an STI structure in an integrated circuit, which can help eliminate the above-mentioned drawbacks of the prior art so as to prevent the bridging effect across the insulating plug of the resulting STI structure.

In accordance with the foregoing and other objectives of the present invention, a new method for fabricating an STI structure in integrated circuit is provided. The method of the invention includes the steps of: preparing a semiconductor substrate; preparing a semiconductor substrate; forming a trench in the substrate; depositing a dielectric material into the trench to thereby form an insulating layer in the trench; removing a surface part of the insulating layer, with the remaining part of the insulating layer serving as an insulating plug in the trench; forming a mending dielectric layer from a flowable dielectric material over the insulating plug;

and performing an etch-back process on the mending dielectric layer until exposing the mask layer. Since the mending dielectric layer is in a flowable state when it is being coated over the wafer, it can fill up all the microscratches in the top surface of the insulating plug, thereby mending the microscratches. As a result, the method of the invention can help eliminate the drawback of the bridging effect across the insulating plug that would otherwise occur in the case of the prior art. The method of the invention can thus help the resulting IC device to be more reliable in operation and also can help increase the yield rate of the wafer fabrication.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method of the invention for fabricating an STI structure in integrated circuit is disclosed in full details in the following with reference to FIGS. 2A–2G.

Figure 1A:
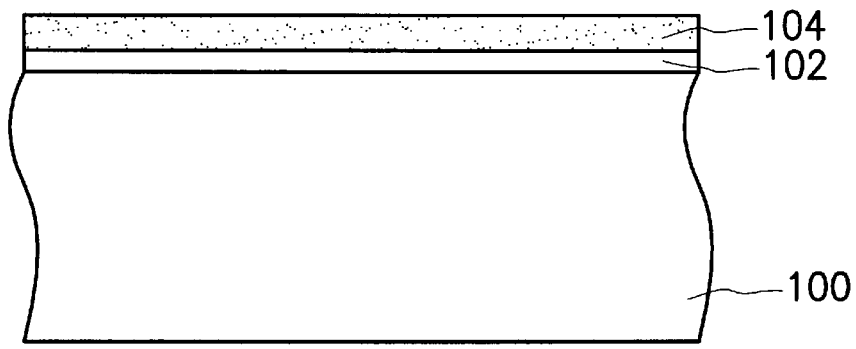
FIGs. 1A–1E are schematic, cross-sectional diagrams used to depict the steps involved in a conventional method for fabricating an STI structure in an integrated circuit.
Figure 1B:
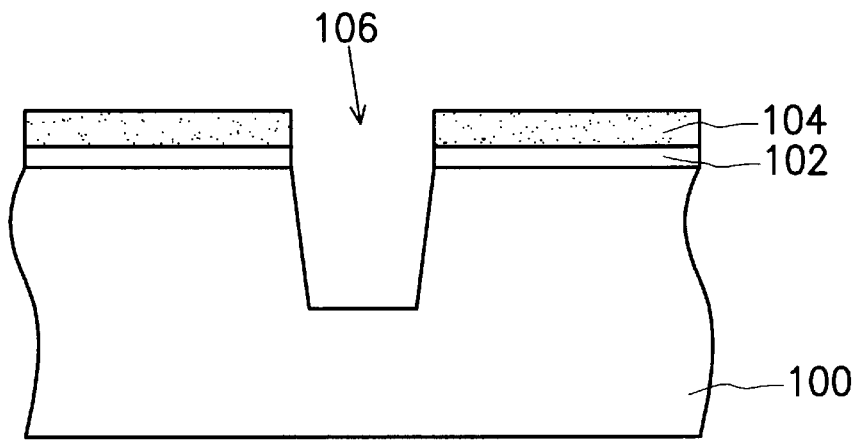
Figure 1C:
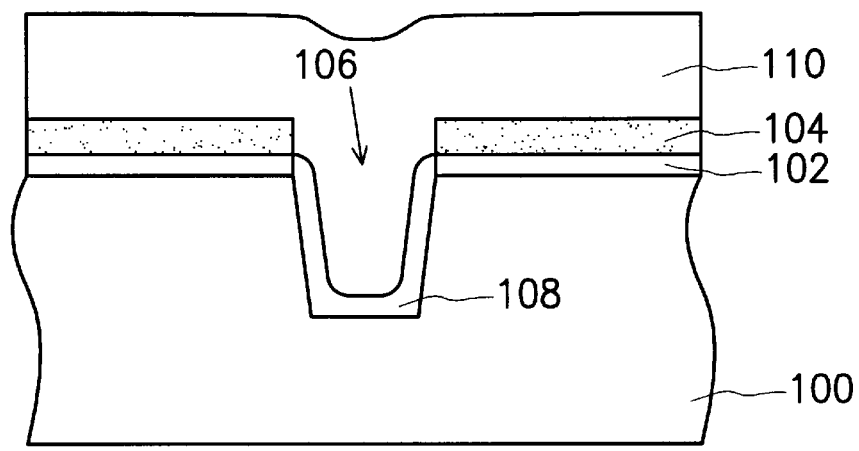
Figure 1D:
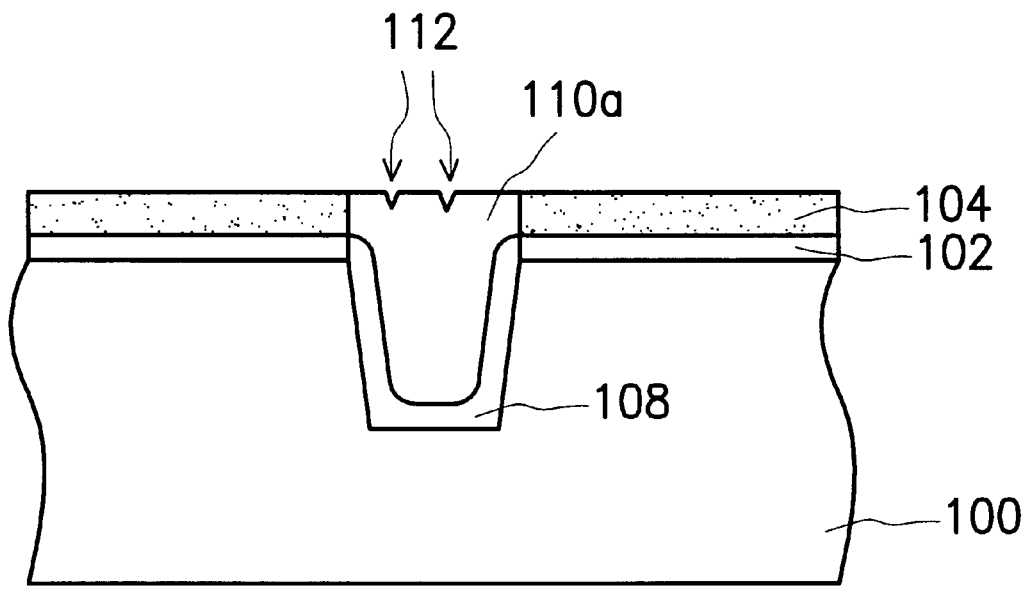
Figure 1E:
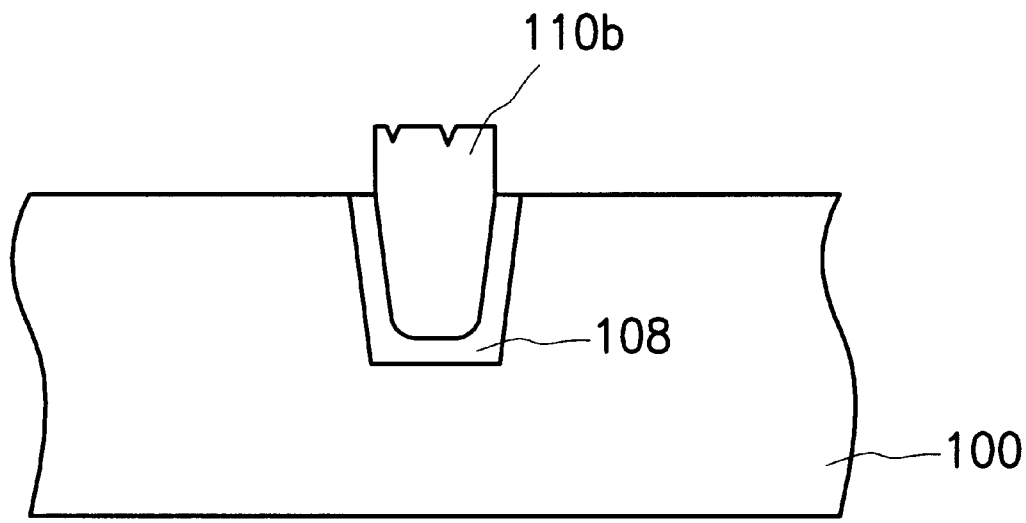
Figure 2A:
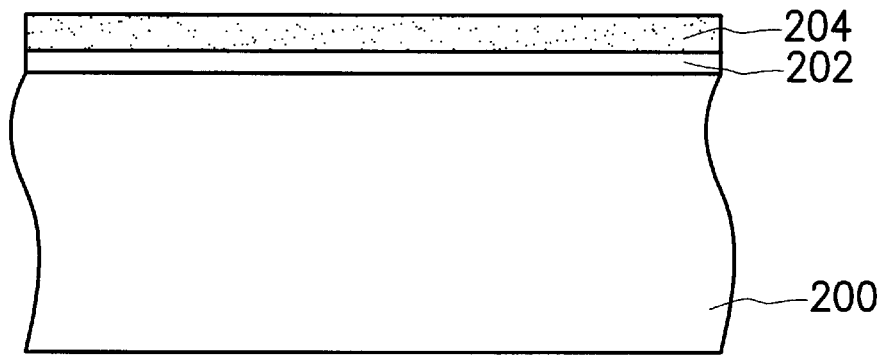
FIGS. 2A–2G are schematic, cross-sectional diagrams used to depict the steps involved in the method of the invention for fabricating an STI structure in an integrated circuit.

Referring first to FIG. 2A, in the first step, a semiconductor substrate 200, such as a P-type silicon substrate, is prepared. Subsequently, a pad oxide layer 202 is formed over the substrate 200 through a thermal oxidation process for surface protection of the substrate 200. After this, a mask layer 204 is formed over the pad oxide layer 202, preferably from silicon nitride through a chemical vapor deposition (CVD) process.

Figure 2B:
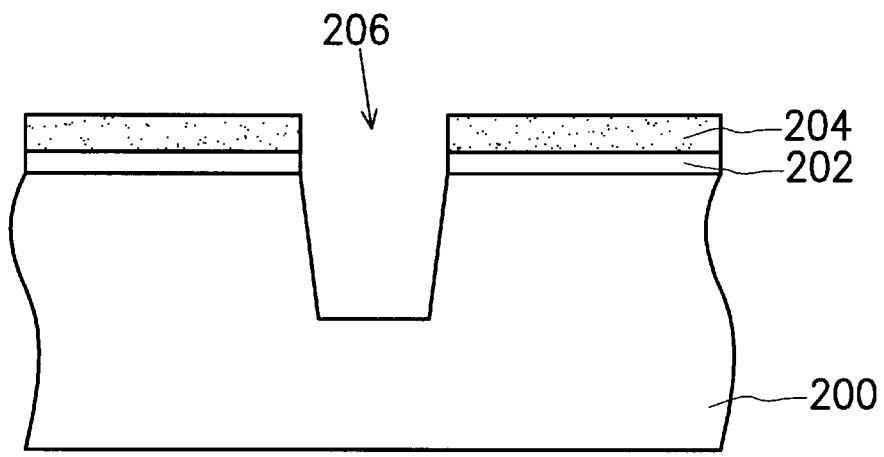

Referring further to FIG. 2B, in the subsequent step, a selective etching process, such as a photolithographic and etching process, is performed to etch into a selected area of the wafer in an anisotropic manner. Etching proceeds successively through the mask layer 204 and the pad oxide layer 202 until reaching a predefined depth in the substrate 200. Through this process, a trench 206 is formed in the substrate 200.

Figure 2C:
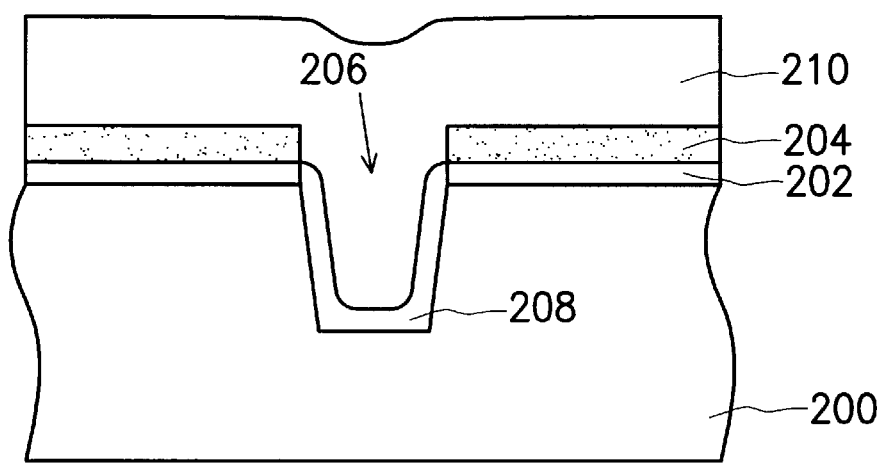

Referring next to FIG. 2C, in the subsequent step, a thermal oxidation process is performed on the wafer, whereby the exposed part of the substrate 200 is oxidized to form a liner oxide layer 208 on the bottom and sidewalls of the trench 206. This liner oxide layer 208 is formed to such an extent as to come into junction with the pad oxide layer 202. Next, a dielectric material, preferably silicon oxide, is deposited through an atmospheric-pressure chemical vapor deposition (APCVD) process into the trench 206 and also over the top surface of the wafer to thereby form an insulating layer 210. During the APCVD process, it is preferable to use tetra-ethyl-ortho-silicate (TEOS) as the deposition source. After this, a densification process is performed on the wafer at a temperature of about 1.000° C. in an oxygen environment for a continuous period of from 10 to 30 minutes so as to densify the insulating layer 210. In this densification process, oxygen is used instead of nitrogen to allow the resulting insulating layer 210 to be denser.

Figure 2D:
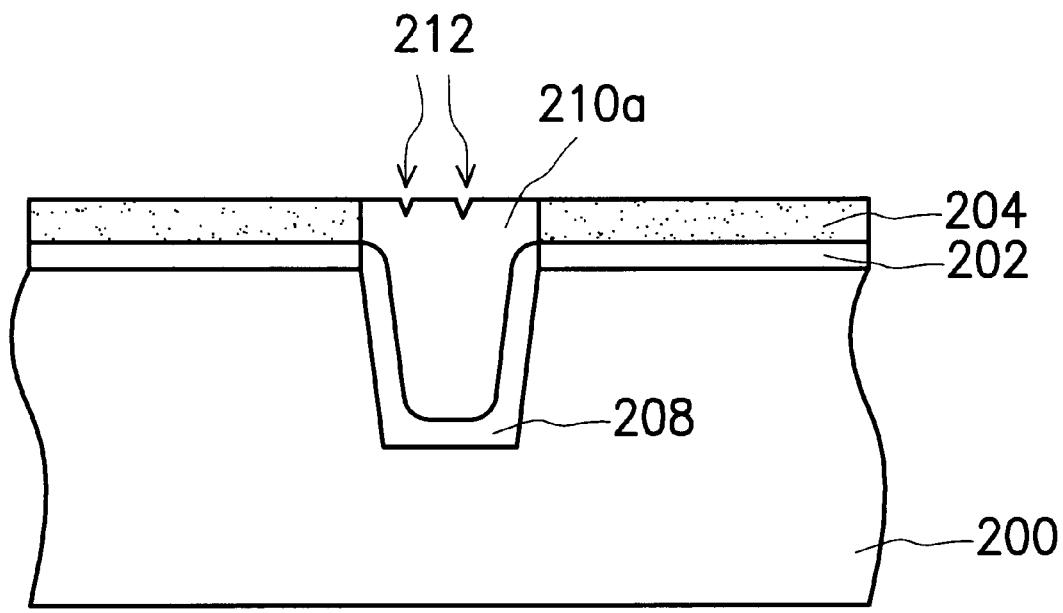

Referring next to FIG. 2D, in the subsequent step, a chemical-mechanical polishing (CMP) process is performed on the wafer until reaching the top surface of the mask layer 204, whereby all the surface part of the insulating layer 210 that is laid above the mask layer 204 is removed (the remaining part is here designated by the reference numeral 210a and is here and hereinafter referred to as an insulating plug). As mentioned in the background section of this specification, microscratches 212 are undesirably formed in the top surface of the resulting insulating plug 210a during the CMP process.

Figure 2E:
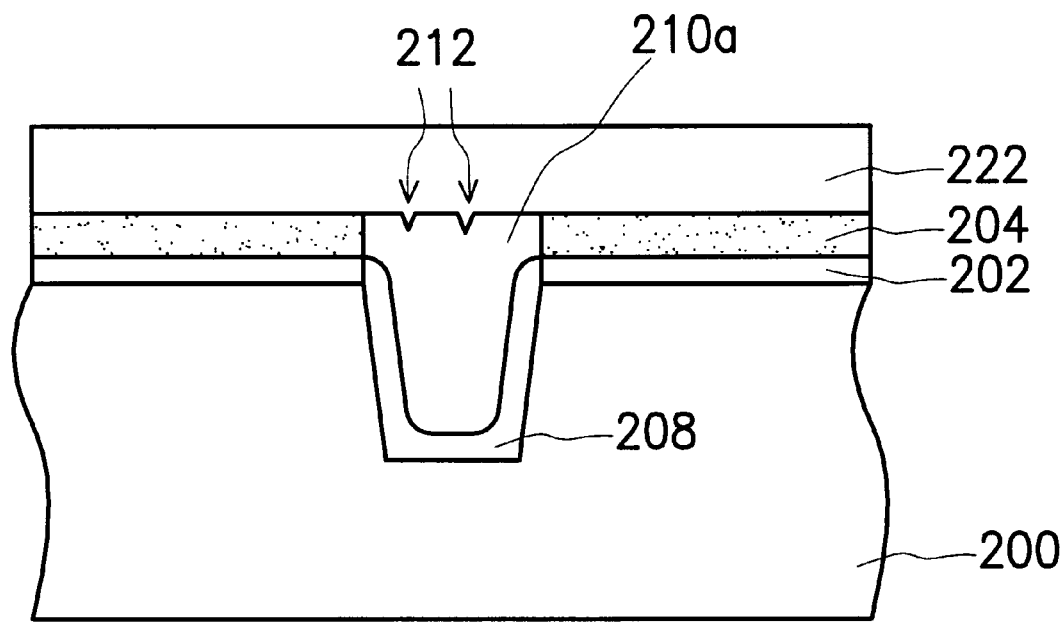

Referring further to FIG. 2E, in the subsequent step, a flowable, low-K (low dielectric constant) dielectric material is coated over the entire top surface of the wafer to thereby form a coating (referred to as a mending dielectric layer 222 in this specification) to a thickness of from about 2,500 Å=0 to 3,000 Å. The flowable low-K dielectric material can be either a spin-on polymer (SOP) selected from the group consisting of Flare, SILK, and Parylene, or a spin-on glass (SOG) such as a flowable oxide (Fox). The mending dielectric layer 222 can be formed by, for example, first performing a spin coating process to coat the selected, flowable dielectric material over the entire top surface of the wafer, covering both the mask layer 204 and the insulating plug 210a, and then performing a thermal-treatment process to cure the coating. Owing to its flowable quality before being cured, the mending dielectric layer 222 fills up all the microscratches 212 in the top surface of the insulating plug 210a, thus mending the scratched insulating plug 210a. This effectively combines the insulating plug 210a and the mending dielectric layer 222 into an integrated insulating layer.

Figure 2F:
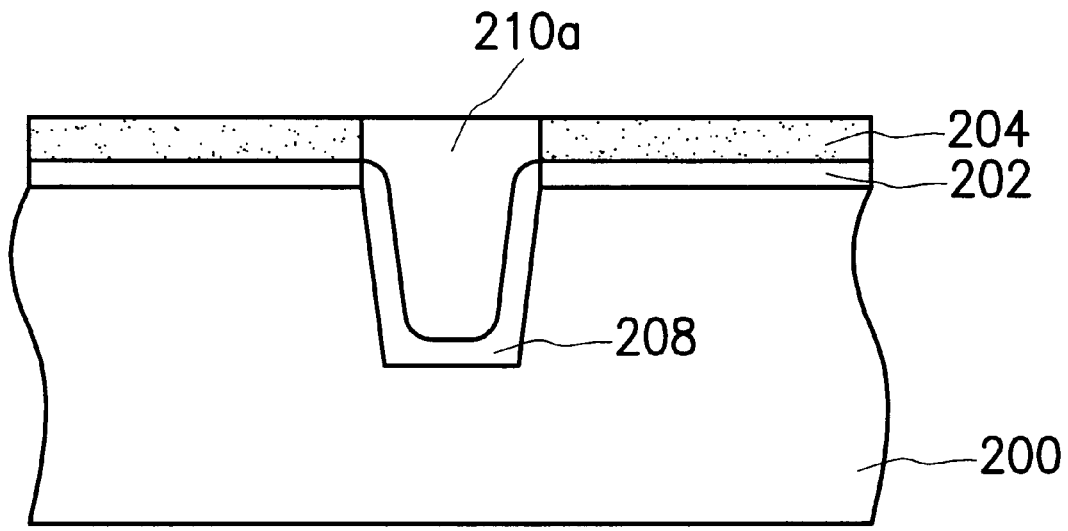

Referring next to FIG. 2F, in the subsequent step, an etch-back process, such as a wet etch-back process or a dry etch-back process, is performed to etch away the mending dielectric layer 222 until exposing the mask layer 204. Through this process, the remaining insulating plug 210a is free from microscratches since those portions of the mending dielectric layer 222 that are filled in the microscratches 212 are not removed.

Figure 2G:
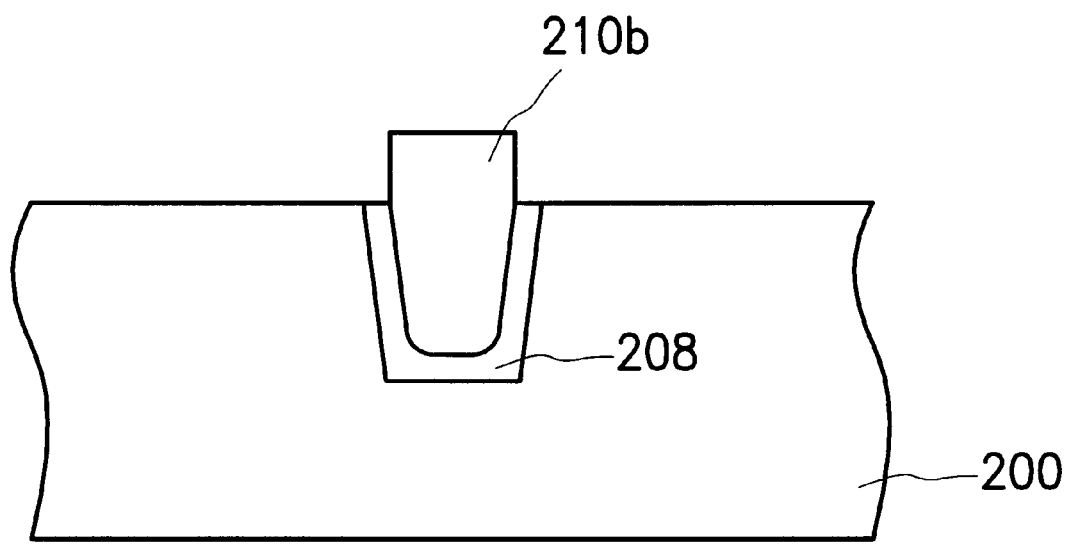

Referring next to FIG. 2G, in the subsequent step, the mask layer 204 is entirely etched away by using a hot phosphate solution as the etchant. Next, the pad oxide layer 202 is also entirely etched away by using hydrofluoric acid (HF) as the etchant. Through these two etching processes, the insulating plug 210a (FIG. 2F) is also partly etched away (the remaining part thereof is here designated by the reference numeral 210b for distinguishing purpose). The remaining insulating plug 210b and the liner oxide layer 208 in the previously formed trench 206 (FIG. 2B) in the substrate 200 in combination constitute the intended STI structure. As demonstratively illustrated in FIG. 2G, the insulating plug 210b in the resulting STI structure is substantially free from microscratches in the top surface thereof. As a result, the drawback of bridging effect across the insulating plug 210b in the prior art is here eliminated.

In conclusion, the method of the invention is characterized by the provision of a mending dielectric layer over the scratched insulating plug of the STI structure so as to mend the microscratches formed in the top surface of the insulating plug that are undesirably resulting from the CMP process. Since the mending dielectric layer is in flowable state when it is being coated over the wafer, it can fill up all the microscratches in the top surface of the insulating plug, thereby mending the microscratches. As a result the method of the invention can help eliminate the drawback of the bridging effect across the insulating plug that would otherwise occur in the case of the prior art. The method of the invention can thus help the resulting IC device to be more reliable in operation and also can help increase the good yield rate of the wafer fabrication.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an STI structure in an integrated circuit, comprising the steps of:

preparing a semiconductor substrate;

forming a pad oxide layer over the substrate;

forming a mask layer over the pad oxide layer;

performing a selective etching process to form a trench at a predefined location in the substrate;

forming a liner oxide layer on the bottom and sidewalls of the trench;

depositing a dielectric material into the trench and over the mask layer to thereby form an insulating layer;

removing a surface part of the insulating layer until exposing the mask layer, the remaining part of the insulating layer serving as an insulating plug;

forming a mending dielectric layer from a flowable dielectric material over the insulating plug;

performing an etch-back process on the mending dielectric layer until exposing the mask layer;

removing the entire mask layer; and removing the entire pad oxide layer.

2. The method of claim 1, wherein the flowable dielectric material used to form the mending dielectric layer is selected from the group consisting of SOP or SOG.

3. The method of claim 2, wherein the SOP is selected from the group consisting of Flare, SILK, and Parylene.

4. The method of claim 2, wherein the SOG is a flowable oxide.

5. The method of claim 1, wherein the mending dielectric layer is formed by the steps of:

coating the flowable dielectric material in a flowable state over the insulating plug; and curing the coating of the flowable dielectric material.

6. The method of claim 5, wherein the curing of the coating of the flowable dielectric material is carried out through a thermal treatment process.

7. The method of claim 2, wherein the mending dielectric layer is coated to a thickness of from about 2,500 Å to 3,000 Å.

8. The method of claim 2, wherein the etch-back process is a wet etch-back process.

9. The method of claim 1, wherein the mask layer is formed from silicon nitride.

10. The method of claim 1, wherein the insulating layer is formed from silicon oxide.

11. The method of claim 10, wherein the insulating layer is formed through a CVD process.

12. A method for fabricating an STI structure in an integrated circuit, comprising the steps of:

preparing a semiconductor substrate;

forming a trench in the substrate;

depositing a dielectric material into the trench to thereby form an insulating layer in the trench;

removing a surface part of the insulating layer, with the remaining part of the insulating layer serving as an insulating plug in the trench;

forming a mending dielectric layer from a flowable dielectric material over the insulating plug; and performing an etch-back process on the mending dielectric layer until exposing the mask layer.

13. The method of claim 12, wherein the flowable dielectric material used to form the mending dielectric layer is selected from the group consisting of SOP or SOG.

14. The method of claim 13, wherein the SOP is selected from the group consisting of Flare, SILK, and Parylene.

15. The method of claim 13, wherein the SOG is a flowable oxide.

16. The method of claim 13, wherein the mending dielectric layer is formed by the steps of:

coating the flowable dielectric material in a flowable state over the insulating plug; and performing a thermal-treatment process to cure the coating of the flowable dielectric material.

17. The method of claim 13, wherein the mending dielectric layer is coated to a thickness of from about 2,500 Å to 3,000 Å.

18. The method of claim 12, wherein the insulating layer is formed from silicon oxide.

* * * * *